(12) United States Patent
Swaminathan

(10) Patent No.: US 6,931,480 B2
(45) Date of Patent: Aug. 16, 2005

(54) METHOD AND APPARATUS FOR REFRESHING MEMORY TO PRESERVE DATA INTEGRITY

(75) Inventor: Shuba Swaminathan, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 558 days.

(21) Appl. No.: 09/941,763

(22) Filed: Aug. 30, 2001

(65) Prior Publication Data

US 2003/0046487 A1 Mar. 6, 2003

(51) Int. Cl.[7] .............................................. G06F 12/00
(52) U.S. Cl. ...................................................... 711/103
(58) Field of Search ................................. 711/103, 106

(56) References Cited

U.S. PATENT DOCUMENTS

| | | | | |
|---|---|---|---|---|
| 5,715,193 A | * | 2/1998 | Norman | 365/185.02 |
| 5,724,285 A | * | 3/1998 | Shinohara | 365/185.25 |
| 6,000,006 A | * | 12/1999 | Bruce et al. | 711/103 |
| 6,240,032 B1 | * | 5/2001 | Fukumoto | 365/222 |
| 6,249,838 B1 | * | 6/2001 | Kon | 711/103 |
| 6,480,416 B2 | * | 11/2002 | Katayama et al. | 365/185.09 |
| 6,493,270 B2 | * | 12/2002 | Chevallier | 365/185.33 |
| 6,636,937 B2 | * | 10/2003 | Peter | 711/103 |
| 6,639,839 B1 | * | 10/2003 | Chou et al. | 365/185.25 |

* cited by examiner

*Primary Examiner*—Matthew Kim
*Assistant Examiner*—Woo H. Choi
(74) *Attorney, Agent, or Firm*—Dickstein Shapiro Morin & Oshinsky LLP

(57) ABSTRACT

A memory utilizes a data refresh algorithm to preserve data integrity over disturbances caused by memory programming or erase operations. The memory device maintains a counter for each memory block or sector. When a memory block or sector is erased or programmed, the associated counter is set to a predetermined value while other counters are incremented or decremented. Whenever a counter reaches a predetermined threshold value, the associated block or sector is refreshed. The threshold value is set to ensure that each block or sector is refreshed before data integrity is adversely affected by disturbances caused by repeated programming and erase operations.

79 Claims, 5 Drawing Sheets

METHOD AND APPARATUS FOR REFRESHING MEMORY TO PRESERVE DATA INTEGRITY

FIELD OF THE INVENTION

The present invention relates generally to memory devices, and, more particularly, to a method and apparatus for refreshing data stored in flash memory cells.

BACKGROUND OF THE INVENTION

Flash memory is a type of nonvolatile memory that can be erased in units of memory called blocks and programmed in bytes. Flash chips are divided into a plurality of main blocks. Each main block is physically isolated from each other main block. The main blocks are further divided into erase blocks. An erase block is also subdivided into sectors which contain bytes. An erase block may contain, for example, 128 sectors each comprising 512 bytes. All of the erase blocks within a main block share a common bit line.

As a result of the architecture of erase blocks, high voltages are required for programming. When a sector is programmed, the high voltages disturb the data stored in the erase blocks within the same main block. This may cause the data in the other erase blocks of the same main block to become corrupted.

Solutions to the disturb effect include both design solutions and algorithmic solutions. One such design solution is to reduce the number of erase blocks in each main block. Since only the data in erase blocks of the same main block is disturbed during programming, reducing the number of erase blocks in each main block reduces the number of erase blocks that are disturbed while programming an erase block. In addition, as a result of a flash chip having more main blocks, there are fewer programs executed in each main block. Both of these factors decrease the disturb effect.

However, increasing the number of main blocks also increases the resources necessary to operate the flash memory. All of the erase blocks within the same main block share certain resources (i.e. a bit line) necessary for reading and writing data. If fewer erase blocks are in each main block, these resources must be duplicated to a greater degree. As a result, the design of a flash chip becomes more complicated and less cost-effective. In addition, more of the space on the flash chip is consumed by the resources to allow the reading and writing of data. Accordingly, there is less space for data to be stored.

One algorithmic solution to the disturb effect is to alternate which erase blocks within a main block are erased and programmed. After an erase block is erased and programmed, it is not erased and programmed again until every other erase block in that main block is erased and programmed. For example, if a main block contains four erase blocks, once erase block 1 is erased and programmed, erase block 1 is not erased and programmed until erase blocks 2, 3 and 4 are erased and programmed.

BRIEF SUMMARY OF THE INVENTION

The present invention mitigates the problems associated with the prior art and provides a unique method and apparatus for refreshing data stored in a flash memory device.

In accordance with an exemplary embodiment of the present invention, a counter is maintained for each erase block of a flash memory device. When a erase block is erased, the counter for that erase block is set to a predetermined value while the counters for the other erase blocks are incremented. When a counter reaches a predetermined threshold, the data stored in the corresponding erase block is refreshed. Counters are maintained in a table with eight byte entries. Five bytes from three table entries constitute the counters for eight erase blocks. One bit from each of the fifteen bytes comprises each counter.

An algorithm that periodically refreshes data in erase blocks is desirable.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to make and use the invention, and it is to be understood that structural changes may be made and equivalent structures substituted for those shown without departing from the spirit and scope of the present invention.

Figure 2:
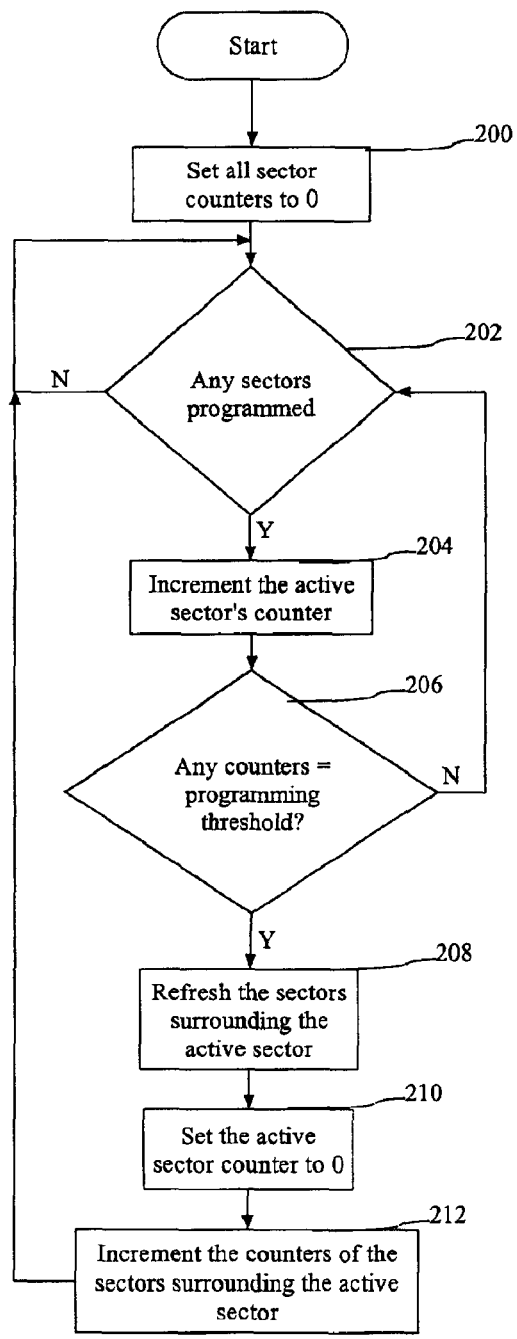
FIG. 2 is a flowchart of an exemplary embodiment of the present invention.

FIG. 2 shows an exemplary embodiment of the present invention. A solution to the disturb effect in which data is refreshed based on the number of times sectors are programmed is illustrated. Since it takes more than one programming operation to corrupt the data in the other erase blocks of the same main block, periodically refreshing the data obviates the problem.

Figure 1:
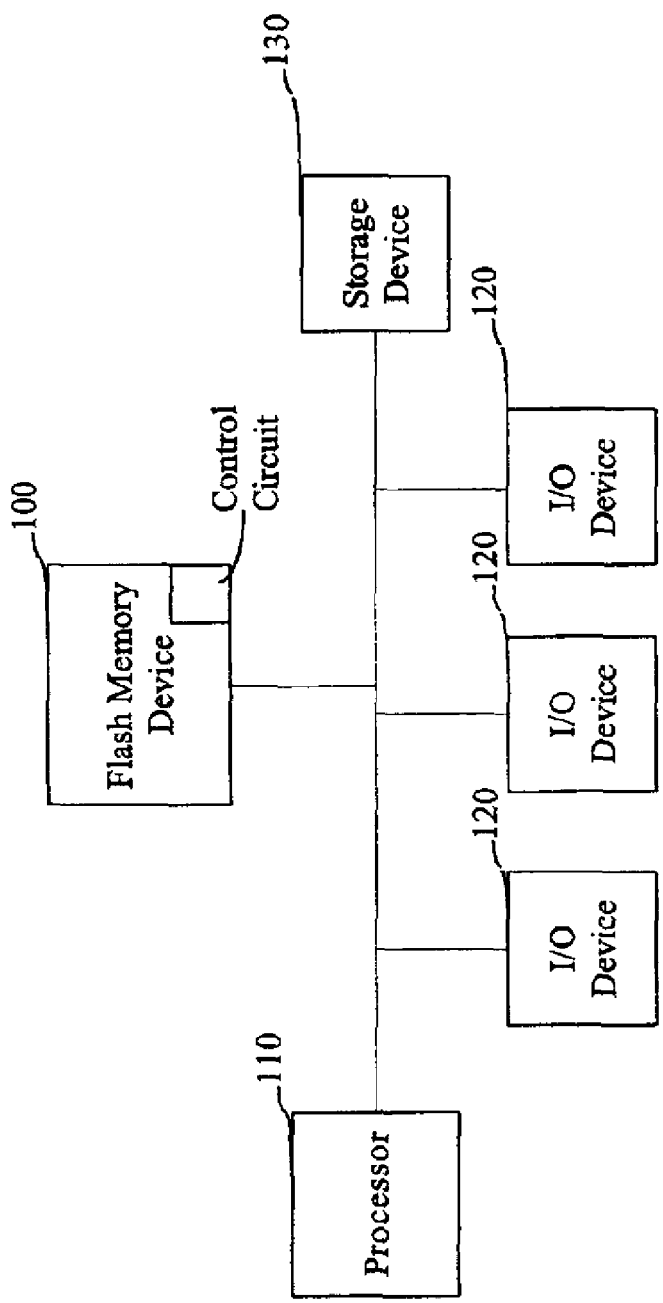
FIG. 1 is a processor circuit which utilizes a flash memory device constructed either in accordance with the prior art or in accordance with the present invention.

Refreshing data, however, creates dead time when the flash memory device is inaccessible to the host system. Consequently, refresh algorithms have been developed to optimize the frequency with which erase blocks are refreshed. For example, flash memory device 100, as illustrated in FIG. 1, may implement the refresh algorithm illustrated in FIG. 2.

Initially, the counters for each sector in flash memory device 100 are set to a predetermined value in segment 200. This predetermined value will generally be zero. After the counters are all set to the predetermined value in segment 200, the control circuit in flash memory 100 checks if a sector was programmed in processing segment 202. If a sector was not programmed in processing segment 202, the control circuit in flash memory 100 continues checking if a sector was programmed.

If a sector was programed, as detected in processing segment 202, the control circuit in flash memory 100 increments the programmed sector's counter in segment 204. The control circuit in flash memory 100 then determines whether any sector counters equal or exceed a predetermined threshold at processing segment 206. The predetermined threshold is set in the software. This threshold will vary for each type of flash memory device depending on many factors that effect how many times nearby sectors can be programmed without corrupting data. Alternatively, counters can be decremented until they equal or are less than a predetermined threshold.

If none of the sector counters equal or exceed the predetermined threshold, as detected at processing segment 206, the control circuit in flash memory 100 returns to processing segment 202 to determine if any sectors have been programmed.

If a sector counter equals or exceeds the predetermined threshold as detected at processing segment 206, as detected at processing segment 206, the control circuit in flash memory 100 initiates a refresh operation for the nearby sectors. The control circuit in flash memory 100 reads the information in each surrounding sector and rewrites the information in segment 208. The counter for the active sector is then set to the predetermined value in segment 210. Finally, the counters for each refreshed sector are incremented in segment 212.

This method requires maintaining counters for each sector of each block. Most flash memories have 128 sectors per erase block. Not only do the counters take up storage space that could be used for memory storage, but due to the large number of counters, the process of determining which sector counter to increment is arduous.

Figure 3:
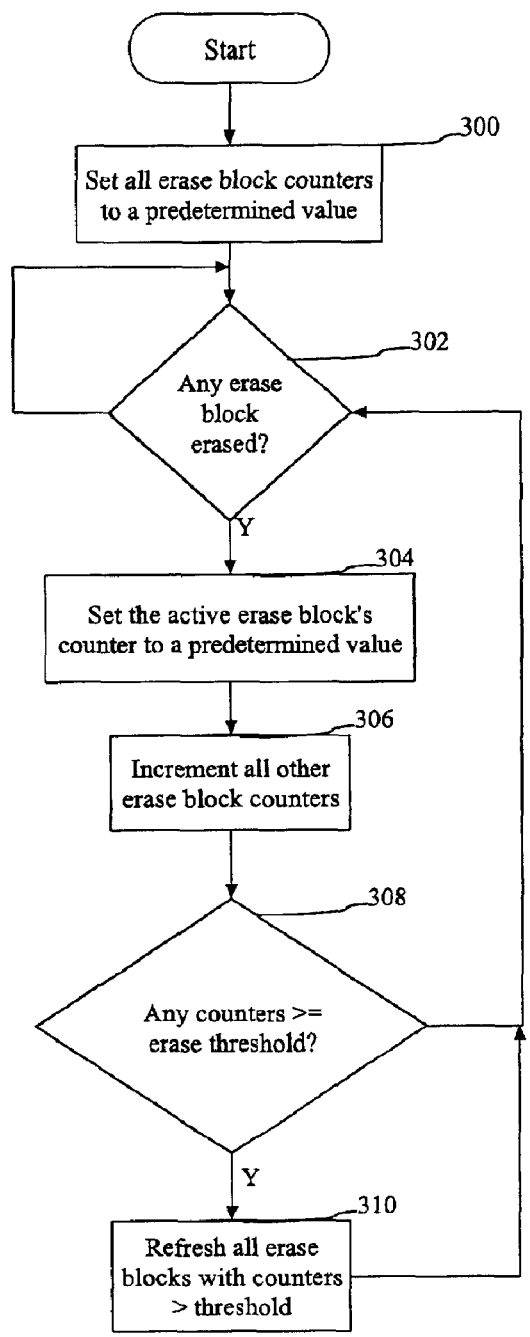
FIG. 3 is a flowchart of another exemplary embodiment of the present invention.

FIG. 3 shows another exemplary embodiment of the present invention. FIG. 3 differs from FIG. 2 in that there is only one counter per erase block instead of a counter for each sector in each erase block. This dramatically reduces the space used for counters.

In addition, instead of incrementing a counter for a sector each time a neighboring sector is written to, each time an erase block is erased, the counters for all of the erase blocks in the same main block are incremented.

Initially, the counters for all of the erase blocks in flash memory 100 are set to a predetermined value at segment 300. When an erase block is erased, as determined in processing segment 302, the control circuit in flash memory 100 resets the active erase block's counter to a predetermined value at segment 304 and increments all erase block counters respectively associated with the non-erased blocks in the same main block at segment 306. The control circuit in flash memory 100 then checks if any of the erase block counters equal or exceed a predetermined threshold at processing segment 308. The control circuit in flash memory 100 then refreshes all erase blocks with counters that equal or exceed the predetermined threshold.

Figure 4:
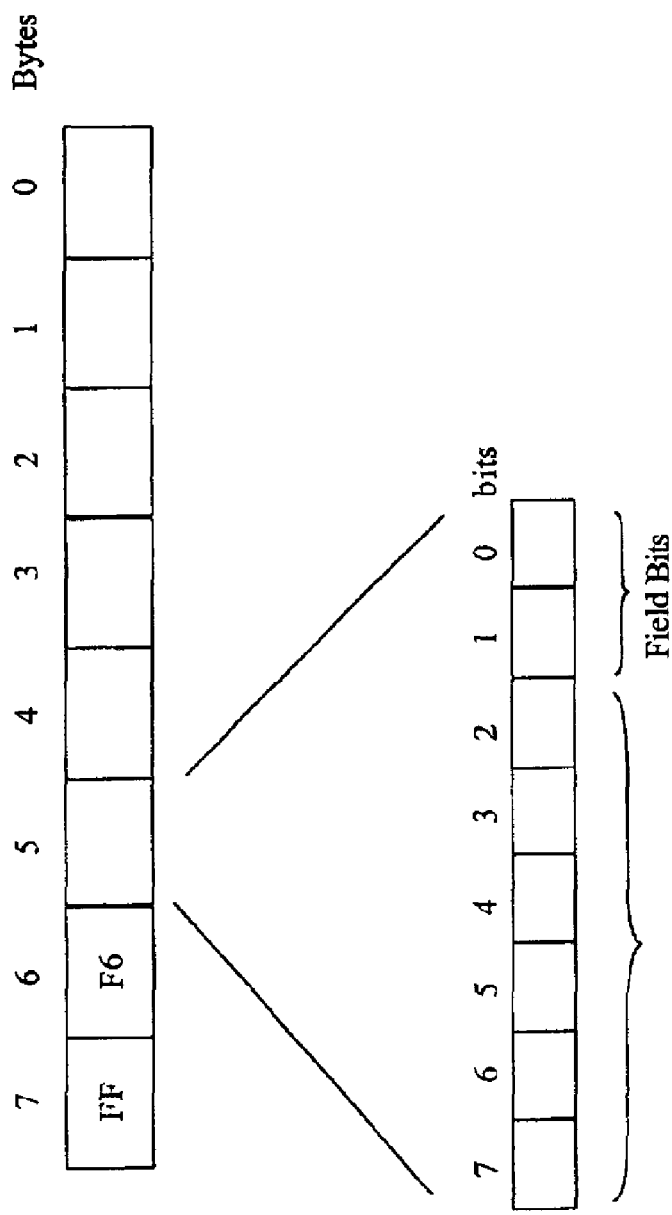
FIG. 4 is a block diagram of an entry in a table used for storing counters.

The counters are stored in a table format in the flash memory. Each entry in the table, as depicted in FIG. 4, is 8-bytes. Each 8-byte entry is divided into three parts. The two most significant bytes of an 8-byte entry are always set to 'FF' (11111111) and 'F6' (11110110) to distinguish between refresh counters and other information present in the table.

The next most significant byte of an 8-byte entry is further divided into two parts. The first part, the two least significant bits, indicate whether the 8-byte entry contains the 5 most significant bits, 5 middle bits or 5 least significant bits of each of the 15 bit counters. Accordingly, these two bits can be set to 00, 01 or 10. The remaining 6 bits indicate which main block this 8-byte entry corresponds to. For example, if a flash memory has 32 erase blocks, those 32 erase blocks could be divided into 8 main blocks, each containing 4 erase blocks. A byte that contains the middle 5 counter bits for the second main block would appear as follows: 000010 01. The value in the two least significant bits is set to 01 to indicate that the byte contains the middle bits (00=5 least significant bits; 01=5 middle bits; and 10=5 most significant bits). The value in the 6 most significant bits is set to a value of 2 to indicate that this byte corresponds to the second main block. Accordingly, there would be two additional 8-byte entries in the table where the 6 most significant bits of the third most significant byte are set to a value of 2. One entry will have the two least significant bits of the third most significant byte set to 00, to indicate that it contains the 5 least significant bits of the counters corresponding to the second main block, and the other entry will have the two least significant bits of the third most significant byte set to 10 to indicate that it contains the 5 most significant bits of the counters corresponding to the second main block. Additionally, there will be three 8-byte table entries for each of the other erase block.

Figure 5:
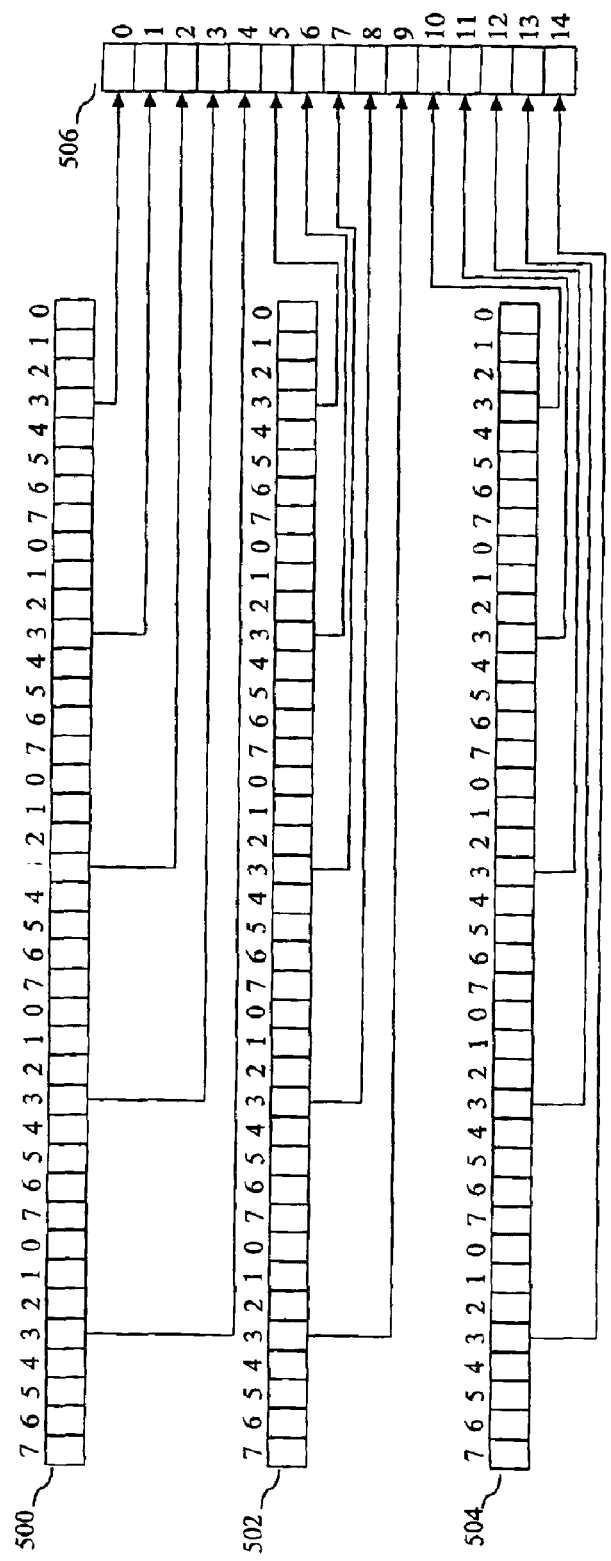
FIG. 5 is a block diagram of a counter for an erase block.

The 5 least significant bytes of each table entry contain the counters. Each of these 5 bytes contains one bit of a 15-bit counter for each of 8 erase blocks. Each counter is a 15 bit value, so it is distributed across 3 table entries 500, 502 and 504, as shown in FIG. 5. One bit from each byte corresponds to counter 506, e.g. the five least significant bits of the counter for erase block 3 506 come from table entry 500, the five middle bits of the counter for erase block 3 506 come from table entry 502 and the five most significant bits for erase block 3 506 come from table entry 504. For example, as shown in FIG. 5, the counter for erase block 3 506 is comprised of the bit 3 of each byte. Similarly, for the first erase block within a group of 8 erase blocks, the least significant bit of each byte compose the counter.

If an erase block contains user data, when that erase block is refreshed, the data is moved to a new location, that is, the data is moved and then the block is erased. By moving the data to a new location, it can be written to and read from the new location. If an erase block contains system data, such as the firmware or a BIOS, the contents refreshed "in place." The contents of the erase block are read into a temporary memory, checked for data integrity, and rewritten over the original data in its original location.

When multiple counters equal or exceed the predetermined threshold value simultaneously, flash memory device 100 may appear busy to processor 110 for an extended period of time. Since this situation is undesirable, the time spent refreshing multiple erase block can be hidden from processor 110 by allowing processor 110 to continue accessing flash memory device 100 between refresh operations. Each erase block that requires refreshing is refreshed after an operation initiated by processor 110, such as, for example, write operations. As a result, instead of using 100% of flash memory 100's capacity during multiple refreshes, and interfering with any other operations being performed by processor 110, each operation that processor 110 performs will take a little longer to complete while a single erase block is refreshed, but the flash memory device being refreshed will be accessible to processor 110 during the refreshes.

While the invention has been described with reference to exemplary embodiments various additions, deletions, substitutions, or other modifications may be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method of operating a flash memory array comprising a plurality of memory blocks, each memory block respectively associated with a counter, the method comprising the steps of:

erasing a selected one of said memory blocks;
responsive to said erasing:
setting the counter associated with said selected one of said memory blocks to a first predetermined value; and
incrementing each counter not associated with said selected one of said memory blocks; and
when a counter equals or exceeds a predetermined threshold value, always refreshing the data in the memory block associated with said counter by:
storing data from the memory block associated with said counter in another one of said memory blocks.

2. A method as in claim 1, wherein said first predetermined value is zero.

3. A method as in claim 1, wherein said refreshing further comprises leaving said data in said different memory block when said refreshing is complete.

4. A method as in claim 1, wherein said refreshing further comprises returning data from said another one of said memory blocks back to the memory block associated with the counter.

5. A method as in claim 4, wherein said data is restored in the same locations in a memory block as it is read from.

6. A method as in claim 1, wherein refreshing comprises dividing said data into pieces, each of said pieces being refreshed after a distinct, unrelated operation is completed by said flash memory array.

7. A method as in claim 6, wherein each of said pieces is refreshed after a write command is executed by said flash memory array.

8. A method as in claim 1, wherein the values of said counters are stored in a table.

9. A method as in claim 8, wherein said table is stored in said flash memory array.

10. A method as in claim 8, wherein said table is stored in a table in a separate memory storage device.

11. A method as in claim 8, wherein the most significant byte and the second most significant byte of each entry in said table are set to predetermined binary values.

12. A method as in claim 11, wherein said predetermined binary values are 11111111 and 11110110.

13. A method as in claim 8, wherein entries in said table contain eight data bytes.

14. A method of operating a flash memory array comprising a plurality of main blocks, each main block comprising a plurality of memory blocks, each memory block respectively associated with a counter, the method comprising the steps of:

erasing a memory block;
responsive to said erasing:
setting a counter associated with said memory block to a first predetermined value; and
incrementing counters respectively associated with all other memory blocks in the same main block;
for each counter which equal or exceed a second predetermined value, always refreshing a memory block associated with said counter by storing data contained in said memory block in a different memory block of said flash memory array.

15. A method of operating a flash memory array comprising a plurality of main blocks, each main block comprising a plurality of memory blocks, each memory block respectively associated with a counter, the method comprising the steps of:

erasing a memory block;
responsive to said erasing:
setting the counter associated with said memory block to a first predetermined value; and
decrementing the counters associated with all other memory blocks within the same main block;
for each counter which is less than or equal to a second predetermined value, always refreshing a memory block associated with said counter by storing data from said memory block in a different memory block of said flash memory array.

16. A method as in claim 14 or 15, wherein said first predetermined value is zero.

17. A method as in claim 14 or 15, wherein in said step of refreshing, data from blocks being refreshed is restored in the same locations it is read from.

18. A method as in claim 14 or 15, wherein said step of refreshing comprises dividing data in blocks being refreshed into pieces, each of said pieces being refreshed after a distinct, unrelated operation is completed by said flash memory array.

19. A method as in claim 18, wherein each of said pieces is refreshed after a write command is executed by said flash memory array.

20. A method of operating a flash memory array comprising a plurality of main blocks, each main block comprising a plurality of memory blocks, each memory block comprising a plurality of sectors each sector respectively associated with a counter, the method comprising the steps of:

programming a sector of one of said memory blocks;
responsive to said programming:
setting a counter associated with the programmed sector to a first predetermined value; and
incrementing each counter associated with each adjacent sector of said one memory block; and
always refreshing the data in a sector of the one memory block of said flash memory array when an associated counter equals or exceeds a predetermined threshold value by storing data contained in that sector to different sector.

21. A method as in claim 20, wherein said first predetermined value is zero.

22. A method as in claim 20, wherein said refreshing further comprises leaving said data in said different sector when said refreshing is complete.

23. A method as in claim 20, wherein said refreshing comprises returning said data from said different sector to said sector.

24. A method as in claim 23, wherein said data is restored in the same locations in a sector as it is read from.

25. A method as in claim 20, wherein when the counters associated with multiple sectors equal or exceed said predetermined threshold simultaneously, said refreshing comprises refreshing some sectors before a distinct, unrelated operation is completed by said flash memory array and refreshing some other sectors after said distinct, unrelated operation is completed by said flash memory array.

26. A method as in claim 25, wherein each of said sectors is refreshed after a next write command is executed by said flash memory array.

27. A method as in claim 20, wherein the values of said counters are stored in a table.

28. A method as in claim 27, wherein said table is stored in said flash memory array.

29. A method as in claim 27, wherein said table is stored in a table in a separate memory storage device.

30. A method as in claim 27, wherein the most significant byte and the second most significant byte of each entry in said table are set to predetermined binary values.

31. A method as in claim 30, wherein said predetermined binary values are 11111111 and 11110110.

32. A method as in claim 27, wherein entries in said table contain eight data bytes.

33. A method of operating a flash memory array comprising a plurality of main blocks, each main block comprising a plurality of memory blocks, each memory block comprising a plurality of sectors, each sector respectively associated with a counter, the method comprising the steps of:
   programming a sector in a memory block;
   responsive to said programming:
      setting a counter associated with said sector to a first predetermined value; and
      incrementing counters respectively associated with all other sectors adjacent to said programmed sector;
   always refreshing all sectors that have associated counters which equal or exceed a second predetermined value by storing data from a sector in a different sector in said flash memory array.

34. A method of operating a flash memory array comprising a plurality of main blocks, each main block comprising a plurality of memory blocks, each memory block comprising a plurality of sectors, each sector respectively associated with a counter, the method comprising the steps of:
   programming a sector in a memory block;
   responsive to said programming:
      setting a counter associated with said sector to a first predetermined value;
      decrementing counters respectively associated with all other sectors adjacent to said programmed sector; and
   always refreshing all sectors that have associated counters which are less than or equal to a second predetermined value by storing data from a sector in a different sector in said flash memory array.

35. A method as in claim 33 or 34, wherein said first predetermined value is zero.

36. A method as in claim 33 or 34, wherein said data is restored in the same locations it is read from.

37. A method as in claim 33 or 34, wherein when the counter associated with multiple sectors equal or exceed said second predetermined value simultaneously, said refreshing comprises refreshing some of said sectors before a distinct, unrelated operation is completed by said flash memory array, and refreshing some other sectors after said distinct, unrelated operation is completed by said flash memory array.

38. A method as in claim 37, wherein each of said pieces is refreshed after a write command is executed by said flash memory array.

39. A flash memory storage device comprising:
   a control circuit; and
   a data storage area divided into a plurality of memory blocks for storing data and a table for storing a plurality of counters values, each one of said counter values being respectively associated with one of said plurality of memory blocks;
   wherein when said control circuit erases data stored in one of said memory blocks, said control circuit sets the counter value associated with said erased memory block to a first predetermined value and increments counter values respectively associated with other memory blocks; and
   wherein when one of said plurality of counter values equals or exceeds a predetermined threshold value, said control circuit always refreshes the data in the memory block associated with said counter by storing the data stored in said memory block in a different memory block.

40. A flash memory storage device as in claim 39, wherein said control circuit optimizes said data prior to restoring said data.

41. A flash memory storage device as in claim 39, wherein when a counter value associated with a memory block equals or exceeds said predetermined threshold value, said control circuit divides said data into pieces, said control circuit refreshing some of said pieces before performing a distinct, unrelated operation and some other of said pieces after performing said distinct, unrelated operation.

42. A flash memory storage device as in claim 41, wherein said control circuit refreshes each of said pieces after performing a next write command.

43. A flash memory storage device as in claim 39, wherein the values of said counters are stored in a table.

44. A flash memory storage device as in claim 43, wherein said table is stored in said flash memory storage device.

45. A flash memory storage device as in claim 43, wherein said table is stored in a separate memory storage device.

46. A flash memory storage device as in claim 43, wherein the most significant byte and the second most significant byte of each entry in said table are set to predetermined binary values.

47. A flash memory storage device as in claim 46, wherein said predetermined binary values are 11111111 and 11110110 respectively.

48. A flash memory storage device comprising:
   a control circuit; and
   a data storage area divided into a plurality of memory blocks, said memory blocks further divided into a plurality of sectors, for storing data and a table for storing a plurality of counter values, each counter value respectively associated with one of said plurality of sectors;
   wherein when said control circuit programs one of said sectors, said control circuit sets the counter value associated with said programmed sector to a first predetermined value and increments counter values respectively associated with all sectors adjacent to said programmed sector; and
   wherein when one of said plurality of counters equals or exceeds a predetermined threshold value, said control circuit always refreshes the data in the sector associated with said counter by storing the data stored in said sector in a different sector.

49. A flash memory storage device as in claim 48, wherein said control circuit optimizes said data prior to restoring said data.

50. A flash memory storage device as in claim 48, wherein when counters associated with multiple sectors equals or exceed said predetermined threshold value simultaneously, said control circuit refreshes some of said sectors before performing a distinct, unrelated operation and some other of said sectors after performing said distinct, unrelated operation.

51. A flash memory storage device as in claim 50, wherein said control circuit refreshes each of said sectors after performing a next write command.

52. A flash memory storage device as in claim 48, wherein said table is stored in said flash memory storage device.

53. A flash memory storage device as in claim 48, wherein said table is stored in a separate memory storage device.

54. A flash memory storage device as in claim 48, wherein the most significant byte and the second most significant byte of each entry in said table are set to predetermined binary values.

55. A flash memory storage device as in claim 54, wherein said predetermined binary values are 11111111 and 11110110 respectively.

56. A processor circuit comprising:
a processor; and
a flash memory storage device coupled to said processor, said flash memory storage device comprising a plurality of memory storage regions and a plurality of counters, each of said plurality of counters associated with one of said plurality of memory storage regions;
wherein when data stored in one of said memory storage regions is erased, the counter associated with said memory storage region is set to a first predetermined value and the remaining counters are incremented; and
wherein when one of said plurality of counters equals or exceeds a predetermined threshold value, the data in the memory storage region associated with said counter is always refreshed by storing data of said memory storage region in a different memory storage region.

57. A processor circuit as in claim 56, wherein said first predetermined value is zero.

58. A processor circuit as in claim 56, wherein said flash memory storage device restores said data to the same locations.

59. A processor circuit as in claim 56, wherein when a memory storage region requires refreshing, said flash memory storage device divides said memory storage region into pieces, said flash memory storage device refreshing some of said pieces before a distinct, unrelated operation is completed by said flash memory storage device and refreshing some other of said pieces after said distinct, unrelated operation is completed by said flash memory storage device.

60. A processor circuit as in claim 59, wherein said flash memory storage device refreshes each of said pieces after new write commands are executed by said flash memory storage device.

61. A processor circuit as in claim 56, wherein the values of said counters are stored in a table.

62. A processor circuit as in claim 61, wherein said table is stored in said flash memory storage device.

63. A processor circuit as in claim 61, wherein said table is stored in a separate memory storage device.

64. A processor circuit as in claim 61, wherein the most significant byte and the second most significant byte of each table entry are set to a predetermined binary values.

65. A processor circuit as in claim 64, wherein said predetermined binary values are 11111111 and 11110110 respectively.

66. A processor circuit comprising:
a processor; and
a flash memory storage device coupled to said processor, said flash memory storage device comprising a plurality of memory storage regions, said memory storage regions being divided into a plurality of sectors, and a plurality of counters, each of said plurality of counters respectively associated with one of said sectors;
wherein when one of said sectors is programmed, the counter associated with said sector is set to a first predetermined value and all of the sectors adjacent to said programmed sector incremented; and
wherein when one of said plurality of counters equals or exceeds a predetermined threshold value, the data in the sector associated with said counter is always refreshed by storing the data stored in said sector to a different sector.

67. A processor circuit as in claim 66, wherein said first predetermined value is zero.

68. A processor circuit as in claim 66, wherein said flash memory storage device returns said data to said sector.

69. A processor circuit as in claim 66, wherein when the counters associated with multiple sectors equal or exceed said predetermined value simultaneously, said flash memory storage device refreshes some of said sectors before a distinct, unrelated operation is completed by said flash memory storage device, and some other of said sectors after said distinct, unrelated operation is completed by said flash memory storage device.

70. A processor circuit as in claim 69, wherein said flash memory storage device refreshes each of said sectors after a write commands are executed by said flash memory storage device.

71. A processor circuit as in claim 66, wherein the values of said counters are stored in a table.

72. A processor circuit as in claim 71, wherein said table is stored in said flash memory storage device.

73. A processor circuit as in claim 71, wherein said table is stored in a separate memory storage device.

74. A processor circuit as in claim 71, wherein the entries in said table comprise N bytes each, each bit of each entry corresponding to one memory block of N based on said bit's position within said byte.

75. A processor circuit as in claim 71, wherein the most significant byte and the second most significant byte of each table entry are set to a predetermined binary values, wherein said predetermined binary values are 11111111 and 11110110 respectively.

76. A method of operating a memory array comprising a plurality of memory blocks, each memory block respectively associated with a counter, the method comprising the steps of:
erasing a selected one of said memory blocks;
responsive to said erasing:
setting the counter associated with said selected one of said memory blocks to a first predetermined value; and
incrementing each counter not associated with said selected one of said memory blocks; and
which counter equals or exceeds a predetermined threshold value, always refreshing the data in the memory block associated with said counter by:
storing data from the memory block associated with said counter in another one of said memory blocks.

77. A method of operating a memory array comprising a plurality of main blocks, each main block comprising a plurality of memory blocks, each memory block comprising a plurality of sectors, each sector respectively associated with a counter, the method comprising the steps of:
programming a sector of one of said memory blocks;
responsive to said programming:
setting a counter associated with the programmed sector to a first predetermined value; and
incrementing each counter associated with each adjacent sector of said one memory block; and
always refreshing the data in a sector of the one memory block of said memory array when an associated counter equals or exceeds a predetermined threshold value by storing data contained in that sector to different sector.

78. A memory storage device comprising:

a control circuit; and a data storage area divided into a plurality of memory blocks for storing data and a table for storing a plurality of counters values, each one of said counter values being respectively associated with one of said plurality of memory blocks;

wherein when said control circuit erases data stored in one of said memory blocks, said control circuit sets the counter value associated with said erased memory block to a first predetermined value and increments counter values respectively associated with other memory blocks; and wherein when one of said plurality of counter values equals or exceeds a predetermined threshold value, said control circuit always refreshes the data in the memory block associated with said counter by storing the data stored in said memory block in a different memory block.

79. A memory storage device comprising:

a control circuit; and a data storage area divided into a plurality of memory blocks, said memory blocks further divided into a plurality of sectors, for storing data and a table for storing a plurality of counter values, each counter value respectively associated with one of said plurality of sectors;

wherein when said control circuit programs one of said sectors, said control circuit sets the counter value associated with said programmed sector to a first predetermined value and increments counter values respectively associated with all sectors adjacent to said programmed sector; and wherein when one of said plurality of counters equals or exceeds a predetermined threshold value, said control circuit always refreshes the data in the sector associated with said counter by storing the data stored in said sector in a different sector.

* * * * *

UNITED STATES PATENT AND TRADEMARK OFFICE
CERTIFICATE OF CORRECTION

PATENT NO. : 6,931,480 B2
DATED : August 16, 2005
INVENTOR(S) : Shuba Swaminathan It is certified that error appears in the above-identified patent and that said Letters Patent is hereby corrected as shown below:

Column 1,
Line 66, "a" should read -- an --.

Column 5,
Line 60, "equal or exceed" should read -- equals or exceeds --.

Column 7,
Line 49, "equal or exceed" should read -- equals or exceeds --.

Column 8,
Line 59, "equals" should read -- equal --.

Column 9,
Line 54, "a predetermined binary values" should read -- predetermined binary values --.

Column 10,
Line 20, "after a" should read -- after --.
Line 35, "a predetermined binary values" should read -- predetermined binary values --.
Line 50, "which counter" should read -- when counter --.

Signed and Sealed this

Twenty-second Day of November, 2005

JON W. DUDAS
*Director of the United States Patent and Trademark Office*